US009841299B2

(12) United States Patent
Tamura

(10) Patent No.: US 9,841,299 B2
(45) Date of Patent: Dec. 12, 2017

(54) POSITION DETERMINING DEVICE, POSITION DETERMINING METHOD, LITHOGRAPHIC APPARATUS, AND METHOD FOR MANUFACTURING OBJECT

(71) Applicant: CANON KABUSHIKI KAISHA, Tokyo (JP)

(72) Inventor: Koichi Tamura, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/948,548

(22) Filed: Nov. 23, 2015

(65) Prior Publication Data

US 2016/0153811 A1 Jun. 2, 2016

(30) Foreign Application Priority Data

Nov. 28, 2014 (JP) .................................. 2014-242526
Aug. 31, 2015 (JP) .................................. 2015-171202

(51) Int. Cl.
*G03F 7/20* (2006.01)
*G01D 5/34* (2006.01)
*G03F 9/00* (2006.01)

(52) U.S. Cl.
CPC ........... *G01D 5/34* (2013.01); *G03F 7/70141* (2013.01); *G03F 9/7011* (2013.01); *G03F 9/7084* (2013.01); *G03F 9/7088* (2013.01)

(58) Field of Classification Search
None
See application file for complete search history.

(56) References Cited

U.S. PATENT DOCUMENTS

| 4,376,581 | A | * | 3/1983 | Mayer ...................... G03F 9/70 355/41 |
| 5,194,743 | A | * | 3/1993 | Aoyama ............... H01L 21/681 250/548 |
| 5,644,400 | A | * | 7/1997 | Mundt .................. H01L 21/681 356/150 |
| 5,929,976 | A | * | 7/1999 | Shibuya ................ G03F 7/2028 355/53 |
| 5,982,492 | A | * | 11/1999 | Oppenheimer ........ G01B 11/26 356/614 |

(Continued)

FOREIGN PATENT DOCUMENTS

| CN | 101794721 A | 8/2010 |
| CN | 102402127 A | 4/2012 |

(Continued)

*Primary Examiner* — Steven H Whitesell Gordon
(74) *Attorney, Agent, or Firm* — Canon USA, Inc. I.P. Division

(57) ABSTRACT

A position determining device includes a first lighting unit configured to emit light to an edge portion of a rotating substrate and a second lighting unit configured to emit light to at least one mark on a surface of the substrate. The alignment device further includes a light receiving unit disposed on a side corresponding to the surface of the substrate and configured to receive light that is emitted from the first lighting unit and then passes through a region outside the substrate and to receive light that is emitted from the second lighting unit and then reflected from the at least one mark. The position of the substrate is determined based on a result of light reception by the light receiving unit.

20 Claims, 7 Drawing Sheets

(56) References Cited

U.S. PATENT DOCUMENTS

| | | | | |
|---|---|---|---|---|
| 6,052,173 | A * | 4/2000 | Miura | H01L 21/681 355/53 |
| 6,545,279 | B1 * | 4/2003 | Yoshida | H01L 22/26 250/341.4 |
| 8,135,486 | B2 * | 3/2012 | Shindo | H01L 21/67259 356/400 |
| 8,305,587 | B2 * | 11/2012 | Heiden | G01B 11/03 250/559.36 |
| 2002/0113218 | A1 * | 8/2002 | Okumura | G03F 7/70691 250/548 |
| 2006/0194123 | A1 | 8/2006 | Mickan et al. | |
| 2006/0285095 | A1 | 12/2006 | Van Buel et al. | |
| 2008/0013089 | A1 * | 1/2008 | Ishii | G03F 9/7011 356/400 |
| 2009/0130784 | A1 * | 5/2009 | Michelsson | G01N 21/8806 438/14 |
| 2016/0078612 | A1 * | 3/2016 | Kodama | G06T 7/0028 382/151 |

FOREIGN PATENT DOCUMENTS

| | | | |
|---|---|---|---|
| JP | 9-139342 | A | 5/1997 |
| JP | 2003-152053 | A | 5/2003 |
| JP | 2007-005794 | A | 1/2007 |
| JP | 2015-018903 | A | 1/2015 |
| TW | 200627085 | A | 8/2006 |
| TW | 201415159 | A | 4/2014 |

* cited by examiner

POSITION DETERMINING DEVICE, POSITION DETERMINING METHOD, LITHOGRAPHIC APPARATUS, AND METHOD FOR MANUFACTURING OBJECT

BACKGROUND OF THE INVENTION

Field of the Invention

The present invention relates to a position determining device, position determining method, lithographic apparatus, and method for manufacturing an object.

Description of the Related Art

An exposure apparatus that transfers a pattern, such as a circuit pattern, to a substrate aligns the substrate before conveyance in order to convey the substrate to a predetermined exposure position. One example exposure apparatus forms a V-shaped cut, called a notch, in the substrate, determines the position of the substrate by detecting the position of the notch, and aligns it so as to correct position deviation from a predetermined position.

However, due to resist leakage into the notch portion or asymmetry of the substrate having the notch, a performance failure of a semiconductor device tends to occur in a region around the notch in steps, including an exposure step and a film formation step. To address this issue and also prevent a decrease in yield, a technique for aligning a substrate having no notch is needed.

Japanese Patent Laid-Open No. 2007-5794 relates to an alignment device having a mechanism of determining a position of a substrate by using a mark on the back surface of the substrate. It determines the position of the substrate by using a sensor for detecting an edge of the substrate and a sensor for detecting the mark on the back surface.

Japanese Patent Laid-Open No. 9-139342 also relates to an alignment device having a mechanism of determining a position of a substrate by using a mark on the back surface of the substrate. It determines the position of the substrate by receiving light reflected from a shot array formed on the front surface of the substrate and light reflected from the mark on the back surface of the substrate by a single image pickup element.

In the alignment device described in Japanese Patent Laid-Open No. 2007-5794, the sensor for detecting the edge and the sensor for detecting the mark are spaced apart from each other. Thus it is necessary to measure relative positions of the two sensors in advance. If an ambient temperature change is large, it may be necessary to frequently measuring the relative positions.

The alignment device described in Japanese Patent Laid-Open No. 9-139342 includes no unit configured to detect an edge. Accordingly, if edge exposure processing of exposing an edge portion along an edge in order to remove unnecessary resist on the substrate is needed, it is necessary to newly detect the edge.

SUMMARY OF THE INVENTION

The present invention provides a position determining device, position determining method, and lithographic apparatus capable of detecting a mark and an edge of a substrate by using a common sensor and determining a position of the substrate.

A position determining device according to an embodiment of the present invention includes a first lighting unit configured to emit light to an edge portion of a substrate, a second lighting unit configured to emit light to at least one mark on a surface of the substrate, a light receiving unit disposed on a side corresponding to the surface of the substrate and configured to receive light that is emitted from the first lighting unit and then passes through a region outside the substrate and to receive light that is emitted from the second lighting unit and then reflected from the at least one mark, and a determining unit configured to determine a position of the substrate based on a result of light reception by the light receiving unit.

Further features of the present invention will become apparent from the following description of exemplary embodiments with reference to the attached drawings.

DESCRIPTION OF THE EMBODIMENTS

First Embodiment

Figure 1:
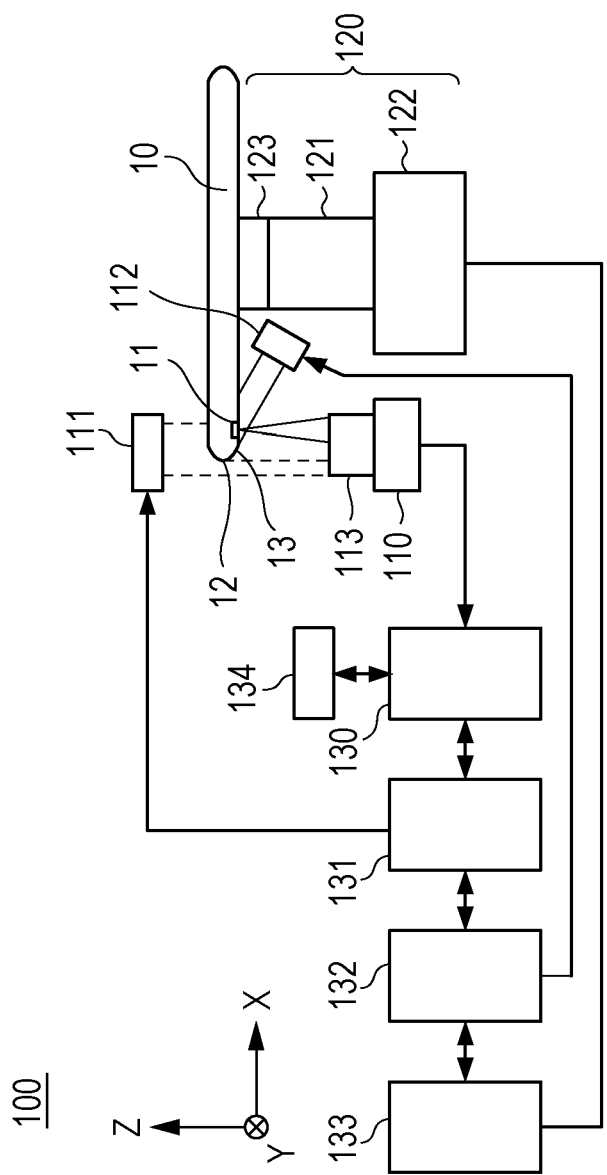
FIG. 1 is a frontal view of an alignment device according to a first embodiment.

FIG. 1 is a frontal view of an alignment device (position determining device) 100 according to a first embodiment of the present invention. FIG. 1 illustrates a state in which a substrate 10 is conveyed onto a stage 120. Before conveying the substrate 10 to a device for performing processing thereon, the alignment device 100 detects the position of the substrate 10 and aligns the substrate 10 to a predetermined standby position based on the detection result. Hereinafter, alignment indicates aligning the substrate 10 to a predetermined position with respect to a translation direction and rotation direction.

The stage 120 includes a rotation stage (rotating unit) 121 for rotating the substrate 10 by using the z-axis direction as its rotation axis, an XY stage 122 for translationally moving the substrate 10 in an XY plane, and a support 123 for supporting the substrate 10.

A substrate that does not have an orientation flat or a cut portion such as a notch is used as the substrate 10. In the present embodiment, a substrate having a diameter of 300 mm is used as the substrate 10. The diameter of the substrate 10 may also be less than 300 mm, in the range of from 300 mm to 450 mm, or more than 450 mm.

A mark 11 is formed on the back surface of the substrate 10 conveyed to the stage 120 in the vicinity of an edge 12. One example of the mark 11 is a mark having an uneven structure formed by laser-marking or other processing. Examples of the patterns of the mark may include a pattern having a plurality of hemispherical concave portions arranged in one row or in a two-dimensional manner, a line-and-space pattern, and a rectangular pattern.

Hereinafter, the front surface of the substrate 10 indicates a surface to be processed (in the present embodiment, an upper surface in the vertical direction), and the back surface of the substrate 10 indicates a surface opposite the surface to be processed (in the present embodiment, a lower surface in the vertical direction). The side where the surface to be processed is positioned in the vertical direction with respect to the substrate 10 is the front-surface side, and the side where the surface opposite the surface to be processed is positioned in the vertical direction with respect to the substrate 10 is the back-surface side.

A first light source (first lighting unit) 111 is disposed on the front-surface side with respect to the substrate 10. A second light source (second lighting unit) 112 is disposed on the back-surface side with respect to the substrate 10. An optical system 113 and a light receiving element (light receiving unit, photodetector) 110 are disposed below the first light source 111 in the vertical direction and on the back-surface side with respect to the substrate 10. The first light source 111 and the second light source 112 are light sources for emitting light from sides corresponding to different surfaces of the substrate 10 and are light-emitting diode (LED) light sources for emitting light having the same wavelength. The light receiving element 110 is an image pickup element, such as a charge-coupled device (CCD) or complementary metal-oxide semiconductor (CMOS).

The light receiving element 110 is disposed on the same side as that of the second light source 112 with respect to the substrate 10 so as to face the first light source 111. That is, an optical element for polarizing a light flux emitted from the light source and bending its optical path is not disposed on the optical path from the first light source 111 to the light receiving element 110 or the optical path from the second light source 112 to the light receiving element 110. By using a reduced number of optical elements in the alignment device 100, space savings around the rotation stage 121 can be achieved.

The first light source 111 emits light to an edge (edge portion) 12 of the substrate 10. In particular, the first light source 111 emits light downward in the vertical direction such that its illumination range includes at least the edge (edge portion) 12, which is the boundary between the substrate 10 and a space outside its outer portion. The second light source 112 emits light at an angle such that it is dark-field illumination to the mark 11.

The light receiving element 110 receives light that is emitted from the first light source 111 and then passes through the space outside the outer portion of the edge 12 (light passing through the region outside the substrate) and light that is emitted from the second light source 112 and reflected from the mark 11 (at least one of reflected diffracted light and reflected scattered light) through the optical system 113. That is, the light receiving element 110 is common to light from the first light source 111 and light from the second light source 112, in other words, common to light passing through the region outside the substrate 10 and light reflected from the mark 11.

The first light source 111 may emit the light by bright-field illumination. When the first light source 111 is not dark-field illumination but bright-field illumination, even if the substrate 10 has a chamfer 13 for removing the corner in the vicinity of the edge 12, the accuracy of measuring the edge 12 can be prevented from being decreased by influence of light reflected at the chamfer 13. As illustrated in FIG. 1, the second light source 112 may emit light from an inner side corresponding to the center of the substrate, in an outwardly direction. Furthermore, the light is emitted at an angle to the surface of the substrate which the mark 11 is provided on. This can prevent the accuracy of detecting the mark 11 or edge 12 from being decreased by influence of light reflected from the chamfer 13.

A controller 130 (determining unit) is connected to the light receiving element 110. The controller 130 detects the mark 11 and the edge 12 from a result of light reception by the light receiving element 110 and determines the position of the substrate 10. A controller 131 is connected to the first light source 111 and adjusts light of the first light source 111. A controller 132 is connected to the second light source 112 and adjusts light of the second light source 112. A controller 133 is connected to the stage 120 and controls driving of the rotation stage 121 and the XY stage 122.

Each of the controllers 130 to 133 includes a central processing unit (CPU), which is not illustrated. The controllers 130 to 133 can exchange information with each other. For example, the controller 133 can drive the stage 120 to align the substrate 10 such that displacement of the substrate 10 determined by the controller 130 is corrected.

Information required for alignment operation is stored in a memory 134 by the controllers 130 to 133. Examples of the stored information may include the position of the substrate 10 determined by the controller 130 (including the position in the rotation direction) and the quantity of light of each of the first light source 111 and the second light source 112. Other examples may be thresholds of signals for use in detection of the mark 11 and in detection of the edge 12. The controllers 130 to 133 and the memory 134 may be arranged on a single control board or different control boards as long as their functions are not impaired.

Next, how the position of the mark 11, the position of the edge 12, and the position of the substrate 10 are determined by the controller 130 is described with reference to FIGS. 2 to 5.

Figure 2:
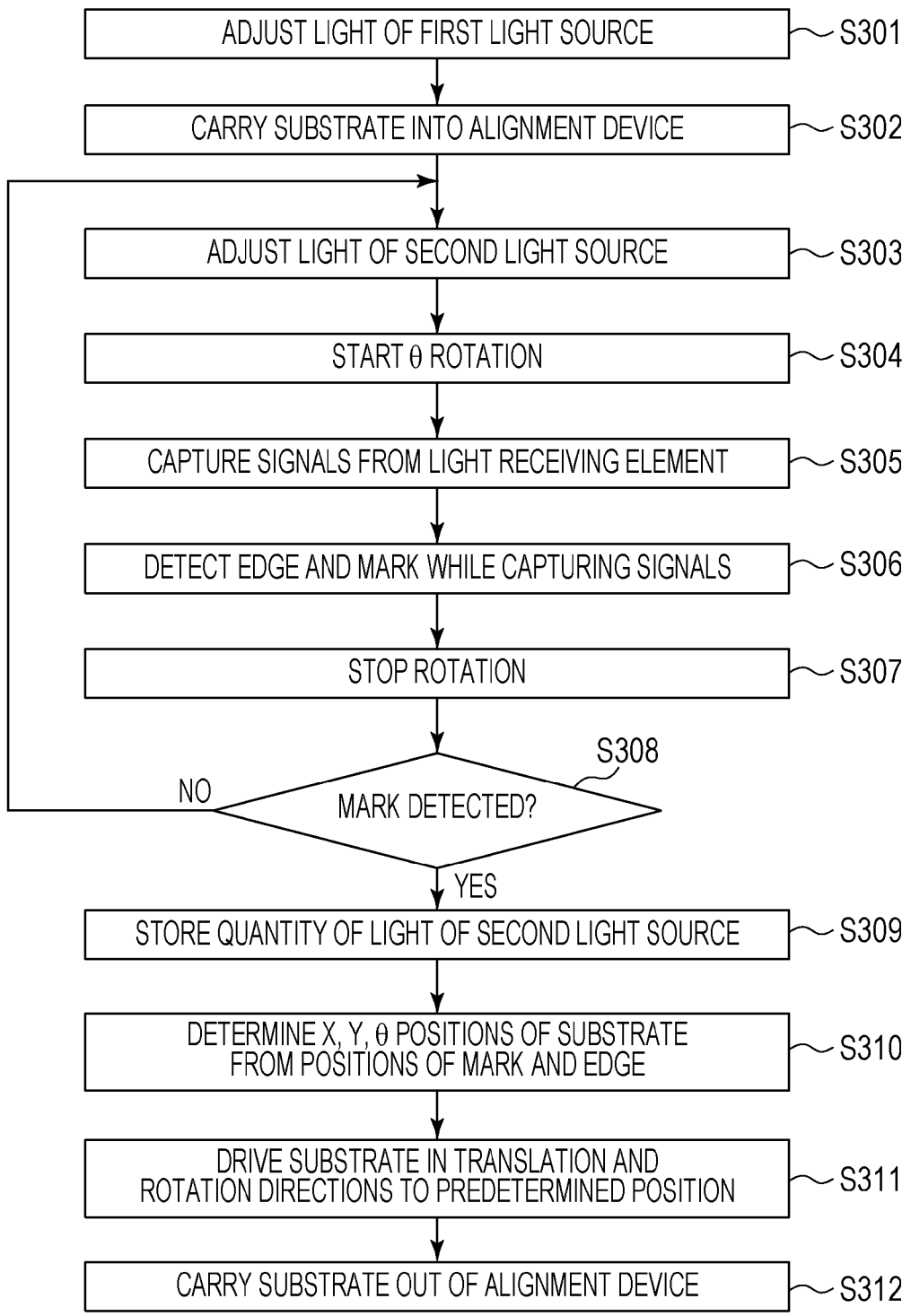
FIG. 2 is a flowchart that illustrates an alignment method according to the first embodiment.

FIG. 2 is a flowchart that illustrates how alignment of the substrate 10 using the alignment device 100 proceeds. Before the substrate 10 is carried into the alignment device 100, the controller 131 adjusts light of the first light source 111 (S301). The quantity of light from the first light source 111 is measured in the light receiving element 110, and the quantity of light of the first light source 111 is adjusted such that a signal intensity indicated by the quantity of light is equal to an optimum value. The light of the first light source 111 may be adjusted when the substrate 10, which would be an obstacle, is not present. If the light is adjusted after the substrate is conveyed, the quantity of light in a portion where light is blocked by the substrate 10 cannot be checked. In this case, the signal intensity may exceed a permissible value during operation of rotating the substrate 10.

Next, the substrate 10 is carried into the alignment device 100 by a loading robot (not illustrated) (S302). The carried substrate 10 is supported by a vacuum suction mechanism (not illustrated) in a support 123. At this point, where the substrate 10 is carried, it has not yet been aligned, and it typically deviates from a target position in the translation direction and rotation direction.

Subsequently, the controller 132 adjusts light of the second light source 112 (S303). Because it is necessary to receive light reflected from the mark 11, when the value of the quantity of light used in previous alignment, the light of the second light source 112 is adjusted by using this value.

The controller 133 rotates the substrate 10 by using the rotation stage 121 (S304). While the rotation stage 121 rotates the substrate 10, the light receiving element 110 receives light that is emitted from the first light source 111 and light that is emitted from the second light source 112 and then reflected from the back surface of the substrate 10. When the second light source 112 emits the light such that its illumination range includes the mark 11, the light receiving element 110 also receives light reflected from the mark 11. The light receiving element 110 receives light from each of the first light source 111 and the second light source 112 while the substrate 10 is rotated and obtains position information about the edge 12 in the substrate 10 continuously in the rotation direction.

The controller 130 captures sequentially light reception signals (S305) and detects the position of the mark 11 and the position of the edge 12 in the substrate 10 by using the captured signals (S306). When the rotation stage 121 rotates the substrate 10 by an amount required for alignment (360° when a single mark is used), the controller 133 stops the rotating operation (S307).

Figure 3:
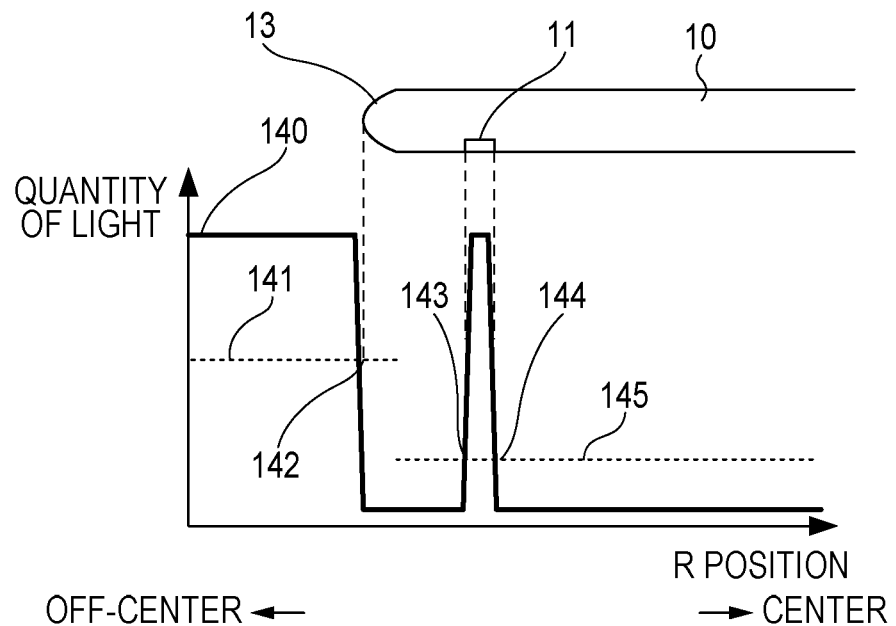
FIG. 3 illustrates a light reception waveform for an edge portion of a substrate according to the first embodiment.
Figure 4:
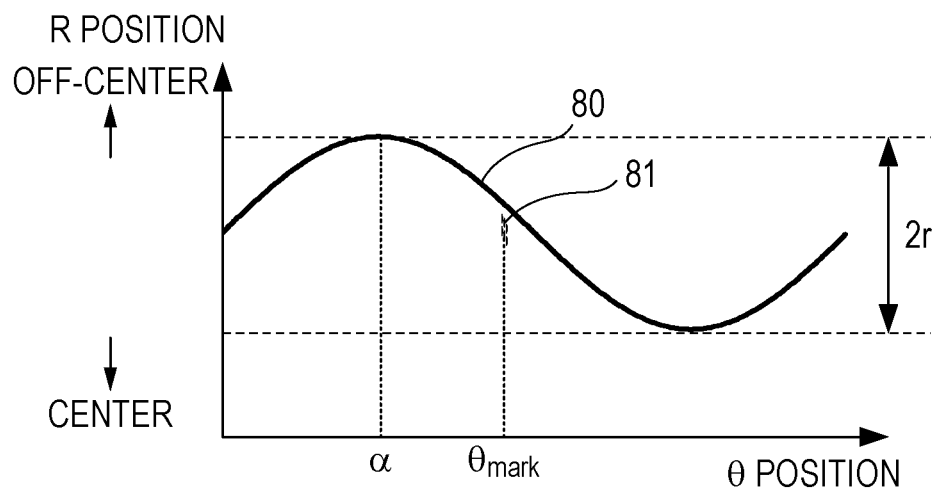
FIG. 4 illustrates a position waveform for an edge according to the first embodiment.

The step S306 is described with reference to FIG. 3. FIG. 3 illustrates a relationship between a waveform 140 of detection signals corresponding to a result of light reception (hereinafter referred to as light reception waveform) and the substrate 10 when the mark 11 is present in a field of view of the light receiving element 110. The horizontal axis indicates a position R of the substrate 10 in a radial direction, and the vertical axis indicates the quantity of light. The light reception waveform 140 illustrates a state in which the quantity of light is large in a region on the outer side of the substrate 10 and in a partial region on the inner side. The quantity of light in the region on the outer side of the substrate 10 corresponds to light that is emitted from the first light source 111 and passes through the portion being not shielded by the substrate 10. The quantity of light in the partial region on the inner side of the substrate 10 corresponds to light reflected from the mark 11.

The controller 130 determines that, in the light reception waveform 140, a position 142, where the quantity of light first falls below a predetermined threshold 141 while a scan moves from the outermost area toward the center of the substrate 10, is the position of the edge 12. Similarly, the controller 130 determines that the central portion between positions 143 and 144, where the quantity of light exceeds a predetermined threshold 145 while the scan moves from the position 142 toward the center side, is the position of the mark 11. The thresholds 141 and 145 may be the same value. In the case where the quantity of light from the first light source 111 and the quantity of light reflected from the mark 11 are different, the thresholds 141 and 145 may be different.

Referring to FIG. 2, the controller 130 determines whether the mark 11 has been detected (S308). When it determines that the mark 11 has not been detected (NO), the processing returns to the step S303 and the quantity of light of the second light source 112 is readjusted. When it is determined in S308 that the mark 11 has been detected (YES), the controller 130 stores the quantity of light of the second light source 112 at this time in the memory 134 (S309). The controller 130 may determine a quantity of light at which an optimum signal intensity is obtainable by using the obtained signal intensity corresponding to the mark 11 and store it in the memory 134.

The controller 130 determines the position of the substrate 10 by using the position of the mark 11 and the position of the edge 12 obtained in the steps S305 and S306. The controller 130 obtains a position waveform 80 corresponding to the edge 12 illustrated in FIG. 4 from the light reception waveform 140 for each rotation angle. The horizontal axis indicates the rotation angle θ, and the vertical axis indicates the position R of the substrate 10 in the radial direction. A mark signal 81 is detected when the rotation angle $\theta = \theta_{mark}$.

The position waveform 80 is expressed by the following equation (1).

$$f(\theta) = r\cos(\theta+\alpha) + \sqrt{L^2 - \{r\sin(\theta+\alpha)\}^2} \quad (1)$$

Figure 5:
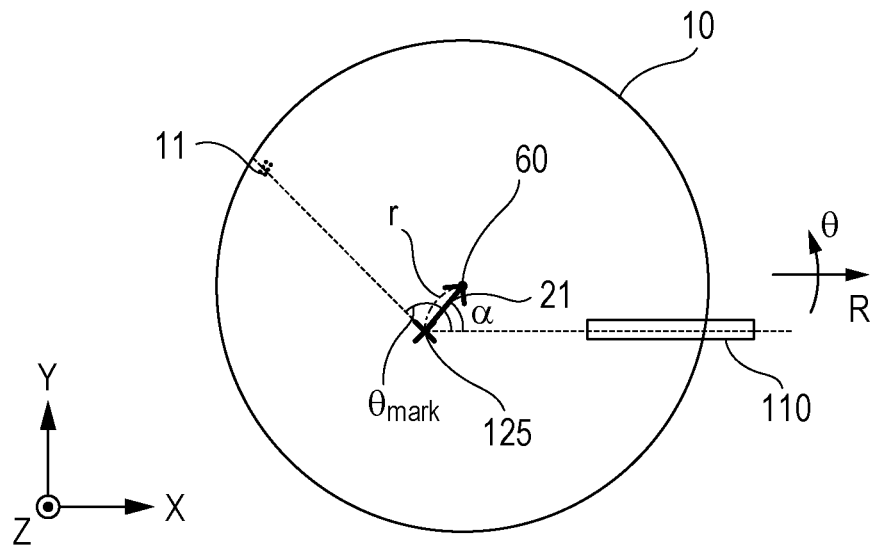
FIG. 5 is a top view that illustrates the alignment device according to the first embodiment.

As illustrated in FIG. 5, when a center 60 of the substrate 10 deviates from a center 125 of the stage 120, r indicates the magnitude of an eccentric vector 21 (X, Y), θ indicates a rotation angle between S304 and S307, α indicates an angle formed between the eccentric vector 21 and a straight line connecting the center 125 and the light receiving element 110, and L indicates a radius of the substrate 10, and $\theta_{mark}$ indicates an angle between a straight line connecting the center 125 and the mark 11 and a straight line connecting the center 125 and the light receiving element 110.

The controller 130 determines the position of the substrate 10 with respect to the stage 120 in the horizontal direction by using the position waveform 80 and determines that in the rotation direction by using $\theta_{mark}$ (S310).

The controller 133 drives the stage 120 in the translation direction and rotation direction by using position information about the substrate 10 determined by the controller 130 and sets the substrate 10 at a predetermined position (S311). Alternatively, a loading robot rearranges the substrate 10 in a predetermined position on the stage 120 by using position information about the substrate 10. Such alignment can prevent a decrease in process accuracy caused by displacement of the substrate 10 during subsequent conveying operation or processing operation.

Finally, the substrate 10 is carried out from the alignment device 100 (S312). Because the edge 12 has also been detected, edge exposure processing may be performed by using the detection result before carrying out in S312.

According to the present embodiment, even with the substrate 10 having no cut, its position can be determined precisely. Thus, a decrease in yield of chips resulting from a decreased accuracy in polishing in the vicinity of a cut or other processing, such a decrease occurring frequently in related art, can be prevented.

Because the common light receiving element 110 receives both light from the first light source 111 and light from the second light source 112, when an image based on both light received at the same time is used, the mark 11 and the edge 12 can be detected at a time.

In comparison with the case where light receiving elements corresponding to individual light sources are disposed, the load of mounting on the alignment device 100 can be reduced and in addition, alignment of the light sources is not required. This can reduce factors for decreasing the accuracy of detecting the mark 11 and the edge 12, and this can lead to precise alignment of the substrate 10.

Second Embodiment

In the alignment device 100 according to a second embodiment, as distance information about a distance from the edge 12 to the mark 11 in the substrate 10, the distance from the edge 12 to the mark 11 or a signal width corresponding to it is stored in the memory 134. The other configurations are substantially the same as in the alignment device 100 according to the first embodiment.

Figure 6:
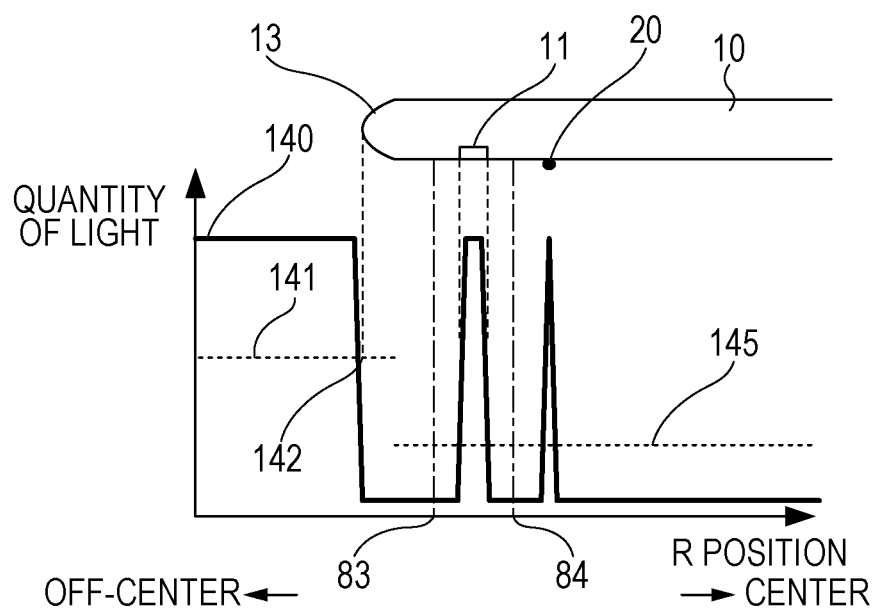
FIG. 6 illustrates a light reception waveform for the edge portion of the substrate according to a second embodiment.

FIG. 6 illustrates a relationship between the light reception waveform 140 and the substrate 10 when the mark 11 exists within a field of view of the light receiving element 110. When a foreign particle 20 adheres to the back surface of the substrate 10, light reflected from the foreign particle 20 is also indicated in the light reception waveform 140. When the signal intensity corresponding to the light reflected from the foreign particle 20 exceeds the threshold 145, the controller 130 may misidentify it as light reflected from the mark 11. The present embodiment is an effective method in such a case.

The controller 130 detects the edge 12 of the substrate 10 by using the light reception waveform 140. The controller 130 determines that a range for detecting the position R for use in identifying the position of the mark 11 is a range between positions 83 and 84 by using the distance from the edge 12 to the mark 11 stored in the memory 134. If there is a signal exceeding the threshold 145 in the range between the positions 83 and 84, the controller 130 determines that the mark 11 exists and identifies the position of the mark 11. Therefore, as in the first embodiment, the mark 11 and the edge 12 can be detected and the substrate 10 can be aligned with a simple configuration.

Figure 7:
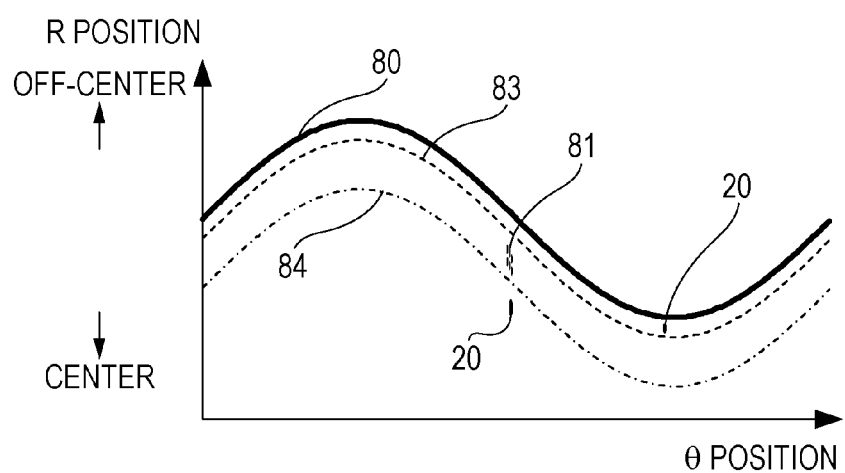
FIG. 7 illustrates a position waveform for the edge according to the second embodiment.

By using the distance from the edge 12 to the mark 11 and a part of a result of light reception in the radial direction for each rotation angle, incorrect detection of the mark 11 caused by light reflected from the foreign particle 20 can be prevented (see FIG. 7). The narrowed detection range can lead to a reduced time required for the detection of the position of the mark 11. Alternatively, a detailed analysis of the light reception waveform 140 within the narrowed detection range can lead to an improved accuracy of detecting the position of the mark 11.

Third Embodiment

If the light receiving element 110 picks up an image in a state where the first light source 111 and the second light source 112 keep illumination while the substrate 10 is rotated, blur in an image of the mark 11 or an image of the edge 12 may occur, depending on the rotation speed. If the image becomes blurred, in the light reception waveform 140, the waveform in a section corresponding to the edge 12 may become choppy, the half-value width of a peak waveform corresponding to the mark 11 may increase, or other similar phenomenon may occur. This may decrease the accuracy of detecting the position of the edge 12 or mark 11.

To address this issue, in the alignment device 100 according to a third embodiment, the controller 131 sets the interval of illumination of the first light source 111, and the controller 132 sets the interval of illumination of the second light source 112. The other configurations are substantially the same as in the alignment device 100 in the first embodiment, and the substrate 10 is aligned by substantially the same technique.

That is, during the rotation of the substrate 10, the first light source 111 and the second light source 112 emit flashing light that repeats being turned on and off at short intervals. This can lead to reduced image blurring and can reduce the influence on the accuracy of detecting the mark 11 and the edge 12.

Image blurring is larger in the rotation direction. Thus, the time for which the second light source 112 illuminates may be shorter than that for the first light source 111. Accordingly, because the quantity of light of the first light source 111 entering the light receiving element 110 is larger, a light source that has a smaller quantity of light (luminance) can be selected as the first light source 111, in comparison with the second light source 112.

Fourth Embodiment

The configuration of the alignment device 100 according to a fourth embodiment is substantially the same as in the first embodiment. Three marks (a plurality of marks) 11 are formed on the single substrate 10 such that they are arranged concentrically with respect to the center 60 of the substrate 10 and are spaced away from each other such that their central angles are each 120°.

In this case, the rotation angle when the controller 130 rotates the substrate 10 between S304 and S307 is only 120°. This is because at least one mark 11 can be detected by a rotation of 120°. In this way, by adjusting the light reception range in the rotation direction depending on the number of the marks 11, the time required for detecting the mark 11 and the edge 12 can be reduced.

If the mark 11 cannot be detected by a rotation of 120°, a lighting condition for the second light source 112 may be changed. Examples of the lighting condition may include the quantity of light and angle of incidence of light on the mark 11.

An increase in signal intensity made by increasing the quantity of light or an improvement in S/N ratio of the signal intensity made by changing the lighting angle enhances the possibility of being able to detect the mark. Examples of the method for changing the lighting angle may include a method for arranging the second light sources 112 at various angles and switching an illuminating element and a method for arranging a plurality of paths for guiding light from the second light source 112 and switching a path by using a mirror. The second light source 112 may be moved by a driving mechanism (not illustrated).

If a combination with the third embodiment is used, the illuminating time may also be included in the lighting condition. The mark 11 can be detected in a short time by changing the lighting condition depending on the number of the marks 11 on the back surface and the rotation angle of the substrate 10 (position of the substrate in the rotation direction).

Another case where the plurality of marks are two or more types of marks 11 is discussed. If they have different line widths or space widths, light from each of the marks 11 can be distinguished from distribution of signal intensities. In this case, the controller 130 identifies the position of the substrate 10 based on the positions and types of the plurality of marks (information about the plurality of marks) and a result of light reception. The substrate 10 is rotated 360°, the plurality of marks 11 are detected, and actual distances of the positions of the marks 11 on the substrate 10 in the rotation direction and the detected distances of the marks 11 in the rotation direction are compared. The influence of measurement error can be reduced, and the accuracy of identifying the position of the substrate 10 can also be enhanced.

Fifth Embodiment

Figure 9:
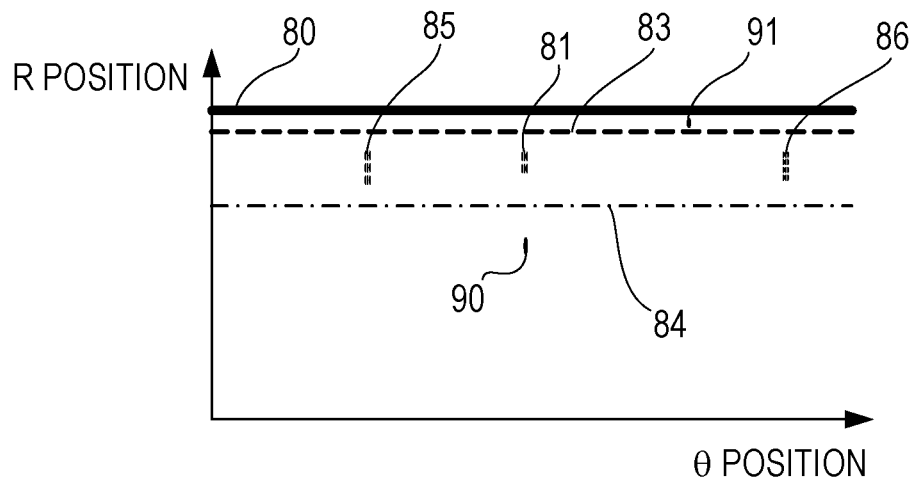
FIG. 9 illustrates a position waveform for an aligned edge according to the fifth embodiment.

In the alignment device 100 according to a fifth embodiment, the shapes of three different types of marks 11 formed on the back surface of the substrate 10 (mark signals 81, 85, and 86 corresponding to the three types of marks 11 are illustrated in FIG. 9) are stored in the memory 134 as a template (sample information about at least one mark). The other configurations are substantially the same as in the alignment device 100 according to the first embodiment.

Figure 8:
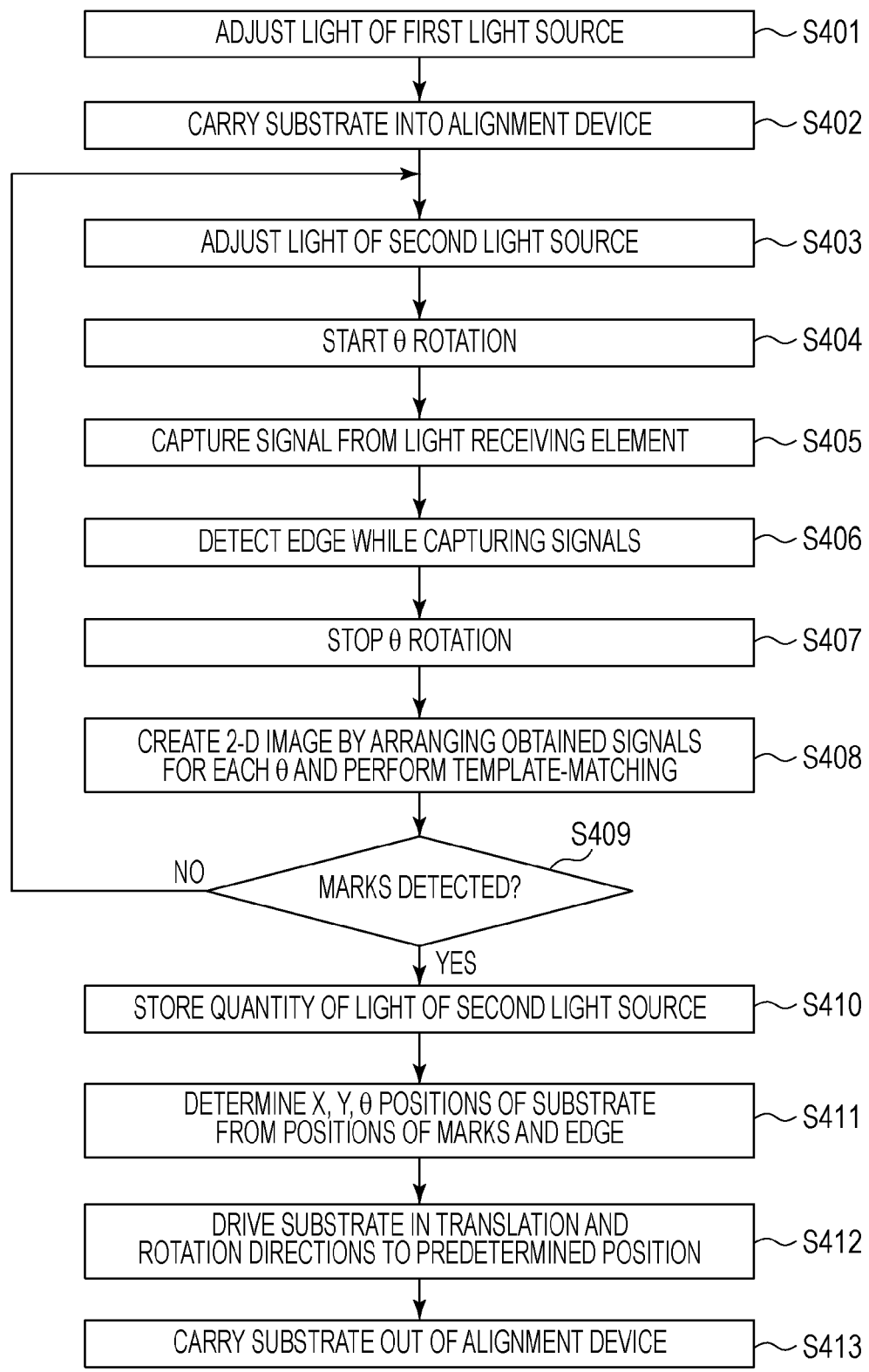
FIG. 8 is a flowchart that illustrates an alignment method according to a fifth embodiment.

FIG. 8 is a flowchart that illustrates how alignment according to the fifth embodiment proceeds. The steps S401 to S405 are substantially the same as the steps S301 to S305 in FIG. 2, the steps S409 to S413 are substantially the same as the steps S308 to S312 in FIG. 2, and these steps are not described here. The description focuses on the steps S406 to S408.

The controller 130 detects only the edge 12 (S406) while obtaining signals from the light receiving element 110 in S405. After the rotation stops (S407), the controller 130 creates a two-dimensional image in which the position of the edge 12 is aligned as illustrated in FIG. 9 by using the signals obtained from the light receiving element 110. In FIG. 9, the horizontal axis indicates the rotation angle θ, and the vertical axis indicates the position R in the radial direction.

The controller 130 creates the two-dimensional image having no distortion resulting from a rotation component and indicated by the mark signals 81, 85, and 86. The controller 130 can identify the position of the substrate 10 by performing template-matching between the mark signals 81, 85, and 86 and the images of the three different types of marks 11 stored in the memory 134 (S408). In such a way, the substrate 10, which does not have a notch, can be aligned precisely based on a result of light reception and the template of the marks 11 (S411, S412).

With the template-matching technique, foreign-particle signals 90 and 91 or other similar signals are not misidentified as mark signals. Even when different types of marks are formed on the substrate 10, their positions can be identified easily. In addition, by using a combination with the second embodiment, the detection range may be narrowed to the area between the positions 83 and 84. In this case, the time required for detection can be reduced.

Sixth Embodiment

A sixth embodiment is an embodiment in which the light receiving element 110 detects transmitted light from the first light source 111 and reflected light that is emitted from the second light source 112 and then reflected from the mark 11 at different timings. That is, first, the edge 12 is detected from an image obtained by using only light emitted from the first light source 111, and then, the position of the mark 11 is detected from an image obtained by using only light emitted from the second light source 112.

A two-dimensional image in which the position of the edge 12 is aligned, similar to the image as illustrated in FIG. 9, is obtainable by performing a rotation operation while correcting the eccentricity of the substrate 10 based on the first obtained position of the edge 12 in detecting the mark 11 by using the second light source 112. In this example, the time required for signal processing can be reduced, in comparison with the case where a two-dimensional image in which the position of the edge 12 is aligned is created from the obtained light reception waveform 140. In addition, when the image-pickup area of the light receiving element 110 is narrowed, the time required for signal processing can be reduced.

Different rotation speeds by the rotation stage 121 may be used in detection of the edge 12 and in detection of the mark 11, depending on the necessary detection accuracy. For example, the number of obtained data elements in the light reception waveform 140 may be reduced by rotating the substrate 10 in detection of the edge 12 at a higher speed than that in detection of the mark 11. In this case, the load in signal processing can be reduced.

Other Embodiments

Other embodiments common to the first to fifth embodiments are described below.

The marks 11 may be marks that are not processed by a user but are formed in advance to define a crystalline azimuth of the substrate 10 under standards. The standard marks are three types of marks, each having an arrangement of a plurality of hemispherical concave portions. The three types of marks have different arrangements of the concave portions and are arranged at intervals of approximately 120° on the back surface of the substrate 10. In this case, the time and step required for independently forming the marks 11 can be omitted. Information about only at least one type of the mark out of the three types of marks and information about the edge may be used.

The standard mark is a mark formed with a positional error of the order of 10 μm in the translation direction and of the order of 0.1° in the rotation direction. Thus, the position of the substrate 10 can be determined more precisely when continuous position information about the edge 12 is obtained together, as in the foregoing embodiments, than that when the position (x, y, θ) of the substrate 10 is determined by measuring the positions of the three standard marks. The position of the substrate 10 can be determined more precisely than that when the position information about the edge 12 is obtained discretely.

The light receiving element 110 may have different sensitivities in a region that mainly receives light from the first light source 111 and in a region that mainly receives light from the second light source 112. The edge 12 and the mark 11 may be detected by rotation of the first light source 111 and the second light source 112, in place of rotation of the substrate 10.

The controller 130 may detect the edge 12 and the mark 11 by using a waveform obtained by performing moving-average processing on the light reception waveform 140. Because signals corresponding to the foreign particle 20 are typically local, in comparison with signals corresponding to the mark 11, noise signals caused by the foreign particle 20 can be reduced.

The moving-average processing is processing that sequentially calculates average values, each being calculated within a fixed interval of time. One example of the moving-average processing may be processing of converting the signal intensity at each angle θ in the light reception waveform 140 into an average value of the signal intensities contained in the range of θ=±1°.

The first light source 111 may emit light upward in the vertical direction from the back-surface side such that its illumination range includes the edge 12, and the optical system 113 and the light receiving element 110 may be arranged above the first light source 111 in the vertical direction. In this case, however, light that is emitted from the second light source 112 and then reflected from the mark 11 is guided into the optical system 113 while its optical path is bent by using another optical system (not illustrated). The light from the first light source 111 may be emitted to the vicinity of the edge 12 by allowing its optical path to be bent by using another optical system (not illustrated).

An illumination method used in the second light source 112 may be bright-field illumination. An illumination method enabling the mark 11 to be detected easily may be selected depending on the material of the substrate 10 or the shape of the mark 11. If the mark 11 is close to the circumference of the substrate 10, light may be obliquely incident from the center side by dark-field illumination. In this case, detection of a small quantity of light including position information about the edge 12 and the mark 11 can be prevented from being inhibited by strongly detected light reflected from the chamfer 13 by the light receiving element 110.

As described above, the light receiving element 110 receives light from at least one of the first light source 111 and the second light source 112 while the rotation stage 121 rotates the substrate 10 in some embodiments.

The first light source 111 and the second light source 112 have equal or different light-source wavelengths. The light to be emitted needs to have a wavelength that does not affect subsequent processing. For example, when the substrate 10 with a photosensitive material, such as a photoresist, applied thereon is used, the surface of the substrate 10 on which the resist is applied is illuminated with light having a wavelength at which the photosensitive material is not exposed (e.g., 450 to 800 nm). When the substrate 10 is made of a material that allows light to pass therethrough, for example, it is a glass substrate, the wavelength may be changed to the one in which the signal intensity is easily exhibited, depending on the substrate. The first light source 111 and the second light source 112 may be light sources other than LEDs.

Implementation on Other Apparatus

Figure 10:
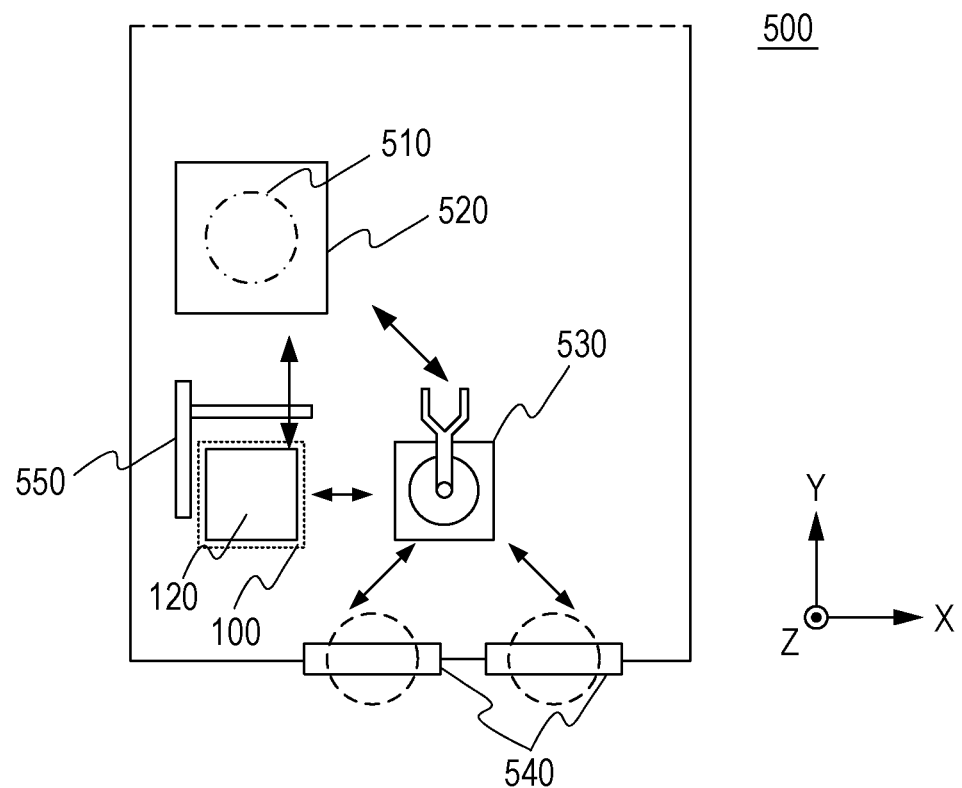
FIG. 10 illustrates a lithographic apparatus including a position detector.

FIG. 10 illustrates an exposure apparatus (lithographic apparatus) 500 in which the alignment device 100 according to the first embodiment is implemented viewed from +Z direction. The exposure apparatus 500 emits, for example, an i line (wavelength 365 nm) by using an optical system 510 and forms a pattern, such as a circuit pattern, on the substrate 10 on an exposure stage 520.

A conveyance arm 530 conveys the substrate 10 in a standby position 540 onto the stage 120 in the alignment device 100. After the alignment device 100 adjusts the standby position of the substrate 10, a delivering arm 550 places the substrate 10 onto the exposure stage 520. After completion of exposing the pattern, the conveyance arm 530 conveys the substrate 10 to the standby position 540.

The exposure apparatus 500 may include a light source (not illustrated) and optical system (not illustrated) different from those described above in the vicinity of the alignment device 100. The exposure apparatus 500 annularly exposes an outer portion (outermost portion or a slightly inner portion thereof) of the substrate 10 (performs edge exposure) based on position information about the edge 12 of the substrate 10 obtained by using the alignment device 100 while rotating the substrate 10 by the rotation stage 121.

A resist that is unnecessary in forming an annular protruded structure in the outer portion of the substrate 10 can be removed. This enables forming an annular protruded portion in a surface to be exposed of the substrate 10 and facilitates plating for preventing separation of a semiconductor layer on the substrate 10 in a plating processing machine (not illustrated) outside the exposure apparatus 500. In particular, an excess supply of a resist to the marginal portion of the substrate 10 or a short supply of the resist to the marginal portion caused by a supply of a resist to an area deviating from a predetermined place can be prevented.

Light (beam) projected by the lithographic apparatus of the present invention to a substrate is not limited to an i line. It may be light in a deep ultraviolet region, such as KrF light (wavelength 248 nm) or ArF light (wavelength 193 nm) or may be a g line (wavelength 436 nm), which is light in a visible light region. The lithographic apparatus may be an apparatus that emits a charged-particle beam to a substrate and forms a latent image pattern on a wafer or may be an apparatus that forms a pattern on a substrate by an imprinting technique.

The alignment device 100 can also be implemented on other processing units that need alignment of the substrate 10.

Method for Manufacturing Object

A method for manufacturing an object according to the embodiments of the present invention includes a step of forming a pattern on a substrate (e.g., wafer or glass plate) by using a lithographic apparatus and a step of performing processing on the substrate with the pattern formed thereon. Examples of the object may include a semiconductor integrated circuit element, liquid crystal display element, image pickup element, magnetic head, compact-disk rewritable (CD-RW), optical element, and photomask. Examples of the processing may include etching and ion implantation. Other known processing steps (e.g., development, oxidation, film formation, deposition, flattening, resist removing, dicing, bonding, and packaging) may also be included.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-242526 filed Nov. 28, 2014 and No. 2015-171202 filed Aug. 31, 2015, which are hereby incorporated by reference herein in their entirety.

What is claimed is:

1. A position determining device comprising:
    a first lighting unit configured to emit light to an edge portion of a substrate arranged on a stage having, as a mark, neither an orientation flat nor a notch;
    a second lighting unit configured to emit light to at least one mark on a surface of the substrate;
    a light receiving unit disposed on a side of the surface of the substrate and configured to receive light that is emitted from the first lighting unit and then passes through a region outside the substrate and to receive light that is emitted from the second lighting unit and then reflected from the at least one mark; and
    a determining unit configured to determine a position of the edge portion and a position of the at least one mark based on a result of light reception by the light receiving unit, and then determine the position of the substrate with respect to the stage based on the determined position of the edge portion and the determined position of the at least one mark.

2. The position determining device according to claim 1, wherein the second lighting unit emits the light at an angle with respect to the surface, of the substrate, where the at least one mark is provided, and in an outwardly direction, from an inner side of the substrate.

3. The position determining device according to claim 1, wherein the first lighting unit is disposed on a side of either one of a front surface and a back surface of the substrate, and the second lighting unit is disposed on the side of the other.

4. The position determining device according to claim 1, further comprising a rotating unit configured to rotate the substrate,
    wherein the light receiving unit receives at least one of the light from the first lighting unit and the light from the second lighting unit while the rotating unit rotates the substrate.

5. The position determining device according to claim 1, wherein the second lighting unit emits the light to the at least one mark on a back surface of the substrate.

6. The position determining device according to claim 1, wherein the determining unit determines the position of the substrate based on the result of light reception and sample information about the at least one mark.

7. The position determining device according to claim 1, wherein the determining unit determines the position of the at least one mark by using only a selected part of the result of light reception in a radial direction of the substrate and information about a distance from the edge portion to the at least one mark.

8. The position determining device according to claim 1, wherein the second lighting unit emits flashing light.

9. The position determining device according to claim 1, wherein the light receiving unit adjusts a light reception range in a rotation direction of the substrate based on the number of the at least one mark.

10. The position determining device according to claim 1, wherein the second lighting unit changes a lighting condition based on the number of the at least one mark and the position of the substrate in a rotation direction of the substrate.

11. The position determining device according to claim 1, wherein the determining unit determines the position of the substrate based on a result of moving-average processing performed on the result of the light reception.

12. The position determining device according to claim 1, wherein the position of the substrate includes a position in each of two directions which are orthogonal to each other in an in-plane of the substrate and a position of a rotation direction around a direction orthogonal to the two directions orthogonal to each other.

13. The position determining device according to claim 1, wherein the determining unit determines an amount of position deviation of the substrate with respect to the center of the stage based on the determined position of the edge portion and the determined position of the at least one mark.

14. A position determining method comprising:
an emitting step of emitting light to an edge portion of a substrate arranged on a stage and to at least one mark provided on a surface of the substrate, the substrate has, as a mark, neither an orientation flat nor a notch;
a receiving step of receiving light passing through a region outside the substrate and light reflected from the at least one mark by using a single light receiving unit;
a first determining step of determining a position of the edge portion and a position of the at least one mark based on a result of light reception in the receiving step; and
a second determining step of determining the position of the substrate with respect to the stage based on the determined position of the edge portion and the determined position of the at least one mark determined in the first determining step.

15. The position determining method according to claim 14, wherein the at least one mark on the substrate comprises a plurality of marks, and the position of the substrate is determined based on the result of light reception in the receiving step and information about the plurality of marks.

16. The method according to claim 14, wherein the position of the substrate includes a position in each of two directions which are orthogonal to each other in an in-plane of the substrate and a position of a rotation direction around a direction orthogonal to the two directions orthogonal to each other.

17. A lithographic apparatus comprising:
a position determining device configured to determine a position of a substrate arranged on a stage, the position of the substrate is the position of the substrate with respect to the stage; and
a position adjusting unit configured to adjust the position of the substrate with respect to a stage capable of moving with the substrate placed thereon based on the position of the substrate determined by the position determining device,
wherein the position determining device includes
a first lighting unit configured to emit light to an edge portion of the substrate having, as a mark, neither an orientation flat nor a notch,
a second lighting unit configured to emit light to at least one mark on a surface of the substrate,
a light receiving unit disposed on a side corresponding to the surface of the substrate and configured to receive light that is emitted from the first lighting unit and then passes through a region outside the substrate and to receive light that is emitted from the second lighting unit and then reflected from the at least one mark, and
a determining unit configured to determine a position of the edge portion and a position of the at least one mark based on a result of light reception by the light receiving unit, and then determine the position of the substrate with respect to the stage based on the determined position of the edge portion and the determined position of the at least one mark, and
the lithographic apparatus forms a pattern on the substrate adjusted by the position adjusting unit.

18. The lithographic apparatus according to claim 17, wherein the lithographic apparatus performs edge exposure on the substrate based on a position of the edge portion of the substrate obtained by the position determining device.

19. A method for manufacturing an object, the method comprising:
a step of forming a pattern on a substrate by using the lithographic apparatus according to claim 17; and
a step of processing the substrate with the pattern formed thereon by the step of forming to manufacture the object.

20. The lithography apparatus according to claim 17, wherein the position of the substrate includes a position in each of two directions which are orthogonal to each other in an in-plane of the substrate and a position of a rotation direction around a direction orthogonal to the two directions orthogonal to each other.

* * * * *